US008848428B2

(12) United States Patent
Lu et al.

(10) Patent No.: US 8,848,428 B2
(45) Date of Patent: Sep. 30, 2014

(54) MEMORY ARCHITECTURES HAVING DENSE LAYOUTS

(75) Inventors: Hau-Yan Lu, Hsinchu (TW); Shih-Hsien Chen, Hsinchu (TW); Chun-Yao Ko, Hsinchu (TW); Felix Ying-Kit Tsui, Cupertino, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 229 days.

(21) Appl. No.: 13/548,421

(22) Filed: Jul. 13, 2012

(65) Prior Publication Data

US 2014/0016399 A1   Jan. 16, 2014

(51) Int. Cl.
*G11C 11/24* (2006.01)
*H01L 27/108* (2006.01)
*G11C 7/00* (2006.01)
*G11C 29/00* (2006.01)
*H01L 29/24* (2006.01)

(52) U.S. Cl.
USPC ........... 365/149; 257/296; 257/300; 365/200; 365/72

(58) Field of Classification Search
CPC .... G11C 11/404; G11C 11/565; G11C 11/24; G11C 16/0433; H01L 27/0207; H01L 27/108; H01L 27/10852; H01L 27/10888; H01L 27/10805; H01L 28/91; H01L 27/1052; H01L 28/40
USPC ..................... 257/296, 300; 365/149, 200, 72
See application file for complete search history.

(56) References Cited

U.S. PATENT DOCUMENTS

| 6,300,662 | B1 * | 10/2001 | Doyle et al. ................. 257/390 |
| 2004/0022100 | A1 * | 2/2004 | Fuhrmann et al. ............ 365/200 |
| 2012/0126224 | A1 * | 5/2012 | Arai ................................ 257/43 |

* cited by examiner

*Primary Examiner* — Richard Elms
*Assistant Examiner* — Ajay Ojha
(74) *Attorney, Agent, or Firm* — Eschweiler & Associates, LLC

(57) ABSTRACT

One embodiment relates to a memory device including a plurality of memory units tiled together to form a memory array. A memory unit includes a plurality of memory cells, which include respective capacitors and respective transistors, disposed on a semiconductor substrate. The capacitors include respective lower plates disposed in a conductive region in the semiconductor substrate. A wordline extends over the conductive region, and a contact couples the wordline to the conductive region so as to couple the wordline to the lower plates of the respective capacitors. The respective transistors are arranged so successive gates of the transistors are arranged on alternating sides of the wordline.

21 Claims, 5 Drawing Sheets

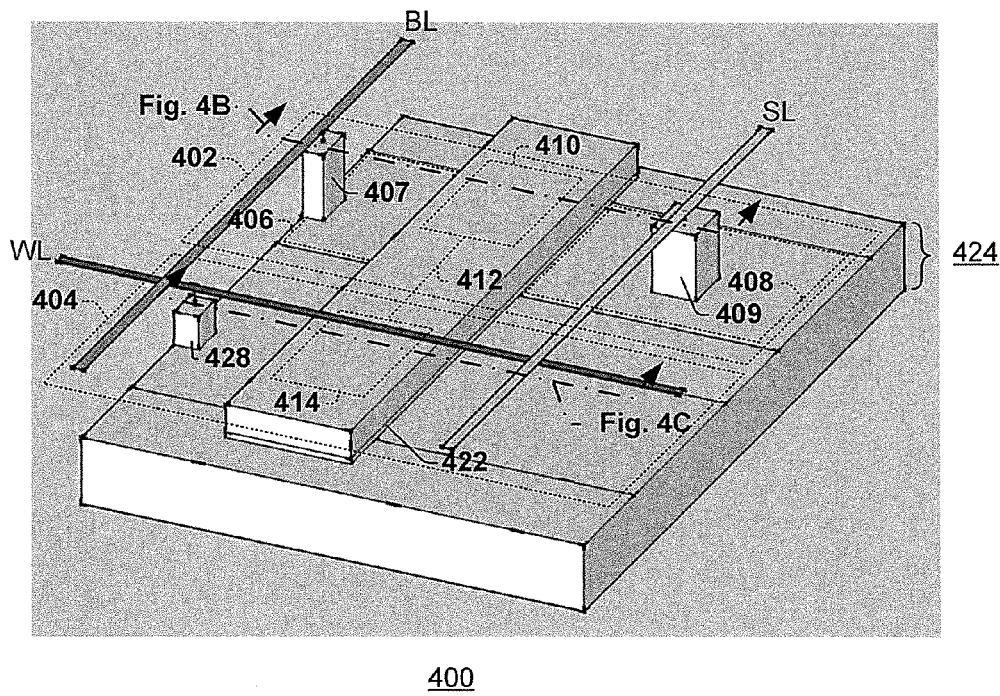
FIG. 4A
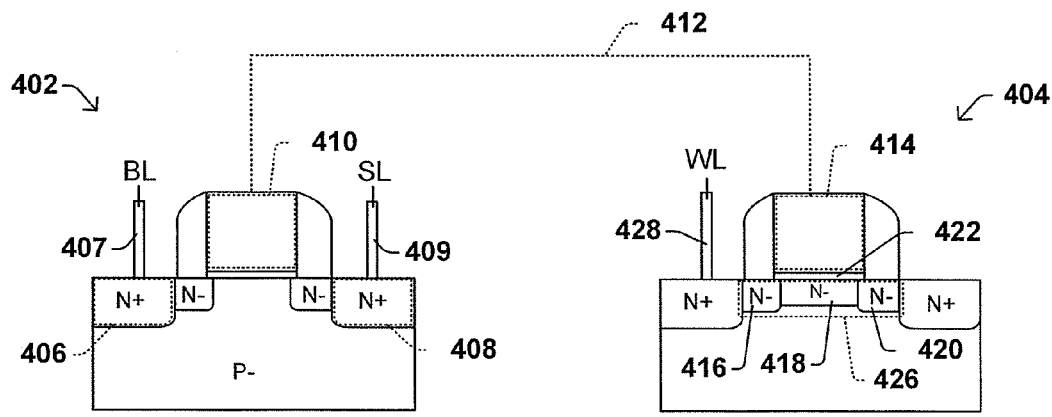
FIG. 4B          FIG. 4C

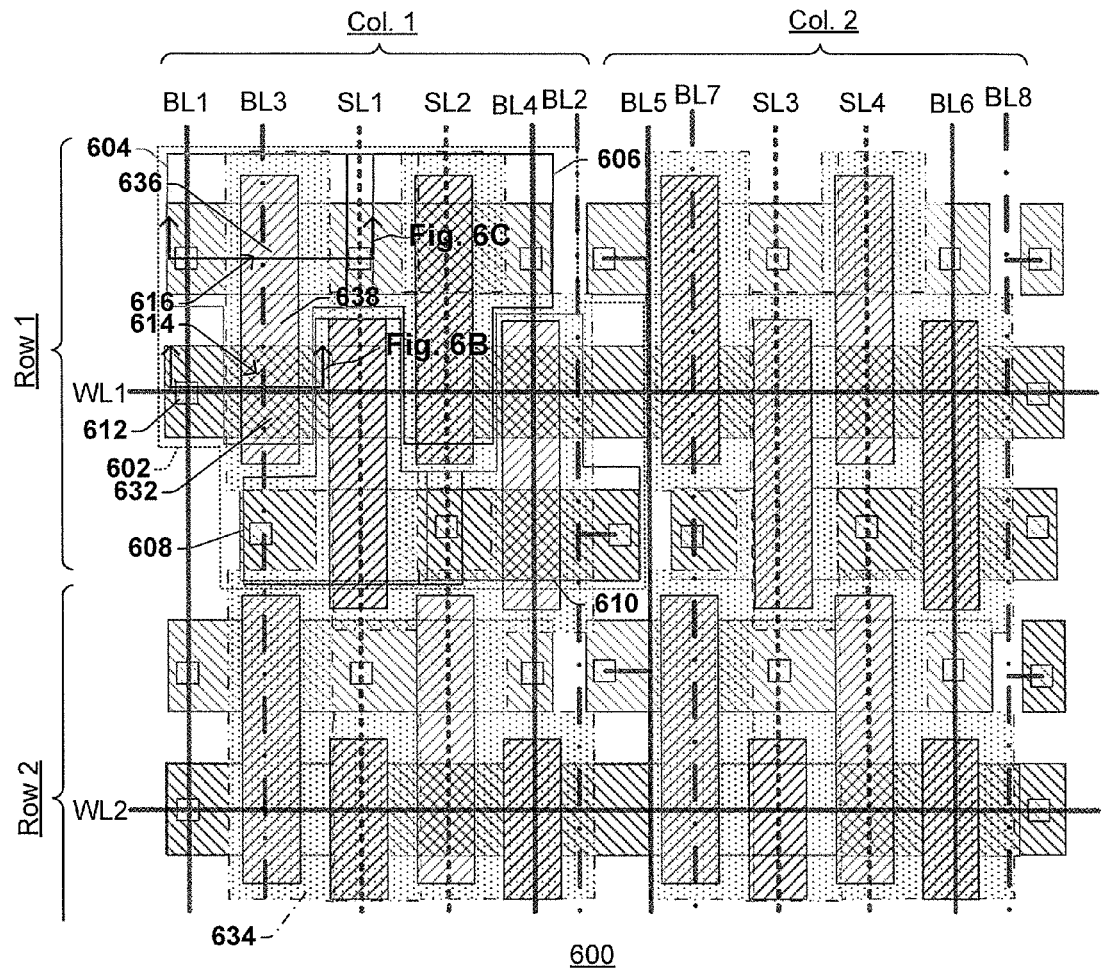
FIG. 6A
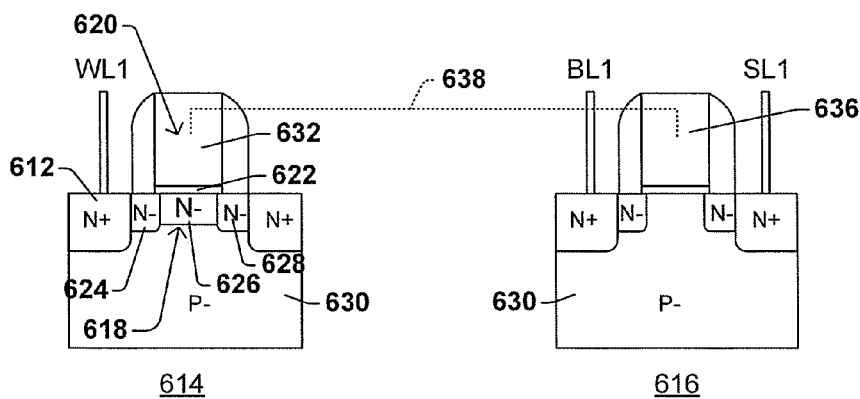
FIG. 6B    FIG. 6C

MEMORY ARCHITECTURES HAVING DENSE LAYOUTS

BACKGROUND

Several trends presently exist in the semiconductor and electronics industry. One trend is that recent generations of portable electronic devices are using more memory than previous generations. This increase in memory allows these new devices to store more data, such as music or images, and also may provide the devices with more computational power and speed, relative to previous product generations.

BRIEF DESCRIPTION OF THE DRAWINGS

FIG. 4A is a perspective view illustrating some embodiments of a 1T1C memory cell.

FIGS. 4B-4C are cross-sectional views of some embodiments of the 1T1C memory cell of FIG. 4A.

FIG. 6A is a top layout view illustrating some embodiments of a memory array.

FIGS. 6B-6C are cross-sectional views of some embodiments of the memory unit of FIG. 6A.

DETAILED DESCRIPTION

Figure 1:
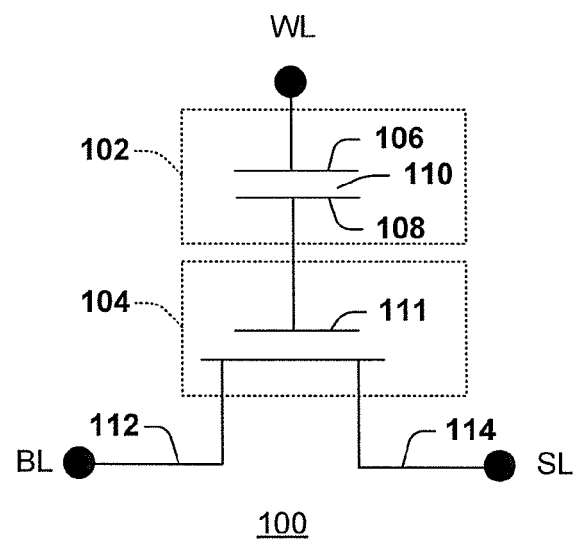
FIG. 1 shows a schematic view of some embodiments of a non-volatile 1T1C memory cell.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Existing embedded non-volatile memory devices, which can make use of a capacitor that stores charge over a gate electrode of a transistor, are well suited for many applications and can be compatible with logic manufacturing processes. However, these memory devices, whose transistors can use a polysilicon gate electrode, typically use a silicide blocking layer (e.g., resist protect oxide (RPO) layer) to increase or maintain charge retention of the floating polysilicon gate electrode. Unfortunately, the silicide blocking layer tends to enlarge the unit area of such memory devices. For example, in one given technology node, the unit area of a non-volatile memory cell can be about 4.4 um$^2$. To reduce this unit area, improved memory array layouts which make use of an alternate gate coupling arrangement have been developed as described herein. In some implementations, these layouts can reduce the unit area of a memory cell from about 4.4 um$^2$ to about 3.3 um$^2$ for a given technology node (e.g., a reduction in area of approximately 25%). Considering the scope of process changes and corresponding time and capital outlay that are undertaken to go from one technology node to the next in the fab (e.g., to approximately double transistor density every 18 months in accordance with Moore's law), this layout change represents a significant improvement due to the ease and cost effectiveness in which it can be implemented.

Figure 2:
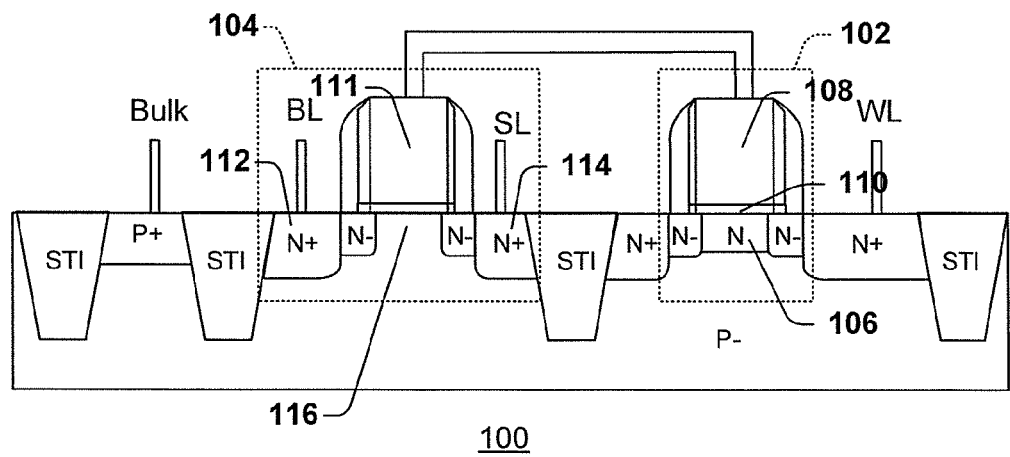
FIG. 2 shows a cross-sectional view of some embodiments of an un-optimized layout for the non-volatile memory cell.

Before delving into improved memory array layouts, FIG. 1 illustrates a non-volatile memory cell 100 which can be arranged within such layouts, and FIG. 2 shows a corresponding but non-optimized cross-sectional view of memory cell 100. Referring to FIGS. 1-2 concurrently, one can see that the memory cell 100 includes a capacitor 102 and a transistor 104, which may also be collectively referred to as a "1T1C memory cell". The capacitor 102 is made up of a first capacitor plate 106, a second capacitor plate 108, and a dielectric 110 separating the first and second capacitor plates 106, 108. The first capacitor plate 106 is coupled to a wordline (WL), which is used to program and/or read from the memory cell 100. The transistor 104, which includes a gate electrode 111 coupled to the second capacitor plate 108, also includes a source region 112 and a drain region 114. The source and drain regions 112, 114 are spaced apart by a channel region 116 under the gate electrode 111, and are coupled to a bitline (BL) and sourceline (SL), respectively. It will be appreciated that the terms source and drain can be interchanged depending on, for example, whether data is being read to or written from a memory cell. Thus, even though the BL in FIG. 1 is shown as acting as source 112, it can also act as a drain 114—the same is true of sourceline SL.

Due to this configuration, the amount of charge stored on the capacitor plates 106, 108 corresponds to a resistance of the channel region 116 and is indicative of a data state stored in the memory cell 100. For example, if the charge stored on the capacitor plates 106, 108 is sufficient to establish a transistor gate-to-source voltage which exceeds a threshold voltage of the transistor 104, the channel region 116 will be conducting, corresponding to a first data state (e.g., logical "0"). On the other hand, if the amount of charge stored on the capacitor plates 106, 108 provides a transistor gate-to-source voltage that is less than the transistor's threshold voltage, the channel region 116 will be non-conducting, corresponding to a second data state (e.g., logical "1"). In some embodiments, finer gradations of stored charge (and corresponding resistances) can be used to store multiple data states (e.g., 3 or more data states) within each memory cell 100.

Figure 3:
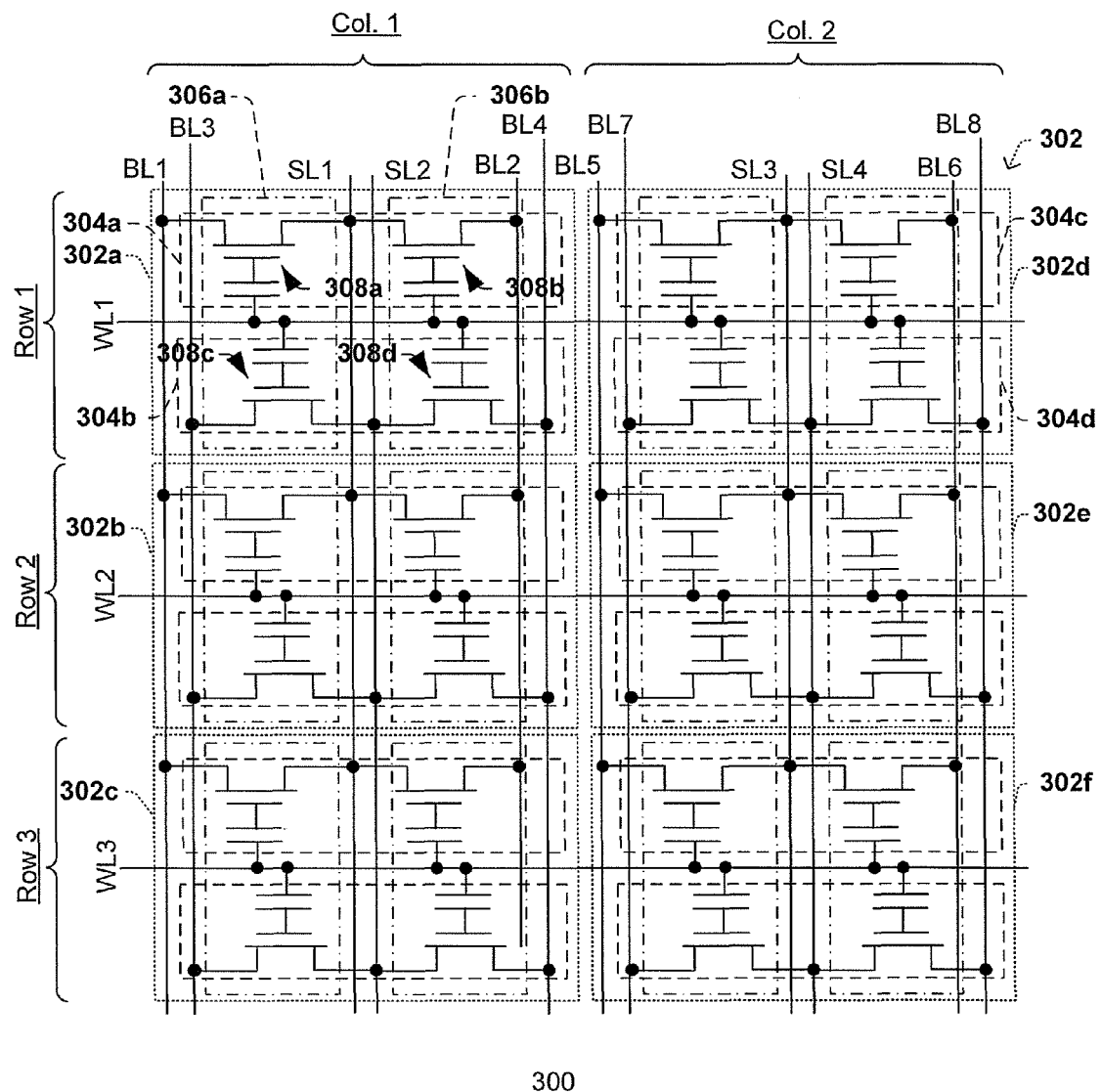
FIG. 3 is a schematic view of some embodiments in which non-volatile memory cells can be arranged in a layout with a dense layout.

FIG. 3 illustrates a schematic depiction of a portion of a memory array 300 arranged on a semiconductor substrate in accordance with some embodiments. The memory array 300 includes a number of memory units tiled together in rows and columns. For example, along Col. 1, the array 300 includes a first memory unit 302a, a second memory unit 302b, and a third memory unit 302c; while along Col. 2, the array includes a fourth memory unit 302d, a fifth memory unit 302e, and a sixth memory unit 302f. The first and fourth memory units 302a, 302d are along Row 1; second and fifth memory units 302b, 302e are along Row 2, and so on. Although the portion of memory array 300 shows only six memory units, it will be appreciated that memory array 300 could be a single memory unit (e.g., 302a) but it will often include billions of memory units, wherein any number of memory units are contemplated as falling within the scope of this disclosure.

Wordlines, which are typically formed in an active area in the semiconductor substrate and which can be covered by an RPO layer, extend in parallel with respective rows. The respective wordlines divide the respective memory units along a given row into respective upper and lower memory cell sub-groups. For example, WL1 divides the memory unit 302a into upper and lower memory cell subgroups 304a, 304b, respectively, and also divides memory unit 302d into upper and lower memory cell subgroups 304c, 304d, respectively. The upper and lower memory cell sub-groups each have multiple respective memory cells therein, wherein the wordline can be coupled to first capacitor plates of each memory cell along the row.

First and second bitlines, which can be formed in metal 1 or higher level interconnect for example, extend along opposite edges of a column of memory units and run perpendicular to the wordline. For example, BL1, BL2 extend along opposite edges of Col. 1, and are coupled to source/drain regions of memory cells 308a, 308b, respectively. Third and fourth bitlines (e.g., BL3, BL4), which are proximate to the first and second bitlines (e.g., BL1, BL2), respectively, also extend along opposite edges of Col. 1. Each bitline can be coupled to a single source/drain region for each memory cell.

One or more sourcelines extend in parallel with respective columns of memory units and are arranged to divide respective memory units along a column into respective left and right memory cell sub-groups each having multiple respective memory cells therein. With regards to the first memory unit 302a, for example, first and second sourcelines SL1, SL2 divide it into a left memory cell sub-group 306a and a right memory cell subgroup 306b. The first sourceline SL1 is coupled to upper memory cells in both the left and right memory cell subgroups, and the second sourceline SL2 is coupled to lower memory cells in both the left and right memory cell subgroups, although other arrangements are within the scope of various embodiments.

Rather than the memory cells of the upper memory cell subgroup (e.g., 304a) being coupled to one sourceline (e.g., SL1) and the memory cells of the lower memory cell subgroup (e.g., 304b) being coupled to another sourceline (e.g., SL2), the memory cells could share the same sourceline in other embodiments. Thus, rather than having a pair of sourcelines (e.g., SL1, SL2) extending between adjacent memory cells of a column as illustrated, a single sourceline could be used instead. However, having the memory cells of the upper and lower subgroups coupled to two sourcelines as illustrated can provide the memory array 100 with read and write times that are approximately twice as fast compared with having only a single sourceline per column. Also, rather than memory cells on the left group (or right group) being coupled to two different bitlines (e.g., 308a, 308c coupled to BL1, BL2, respectively), these memory cells could be coupled to the same bitline. Again, however, having the memory cells of the left subgroup (and right subgroup) coupled to different respective bitlines as illustrated can provide the memory array with improved read and write speeds.

Further, in forming the upper and lower memory cell subgroups (e.g., 304a, 304b) and left and right memory cell subgroups (e.g., 306a, 306b), the wordlines and sourcelines can divide the respective memory units into four quadrants with each quadrant having a single 1T1C memory cell in some embodiments. In some implementations, these quadrants will have areas that are precisely or approximately equal within the confines of a given memory unit. In other implementations, however, there can be small area differences from one quadrant to the next within a given memory unit. Also, respective memory units are often identical to one another, although there may also be small, typically regularly repeating differences over an arrangement of memory units.

FIG. 4A shows a perspective view of a single 1T1C memory cell 400, which is made up of one transistor 402 and one capacitor 404. For clarity of illustration, dielectric regions (other than gate dielectrics) have been omitted from FIG. 4A. FIGS. 4B and 4C show more detailed cross-sectional views of transistor 402 and capacitor 404, respectively. The transistor 402 includes source/drain regions 406, 408, which are separated from one another by a channel region under gate electrode 410. One source/drain region 406 is coupled to a bitline (BL) through contact 407, while the other source/drain region 408 is coupled to a sourceline (SL) through contact 409. Transistor gate electrode 410 extends as shown by reference numeral 412 to form upper capacitor plate 414. Lower capacitor plate 426 is made up of conductive regions 416, 418, 420, which are buried in the semiconductor substrate 424 and therefore not shown in FIG. 4A, wherein capacitor dielectric 422 separates upper and lower capacitor plates 414, 426 from one another. Contact 428 couples wordline WL to lower capacitor plate 426. This 1T1C memory cell 400 can be repeated to form a memory unit.

Figure 5:
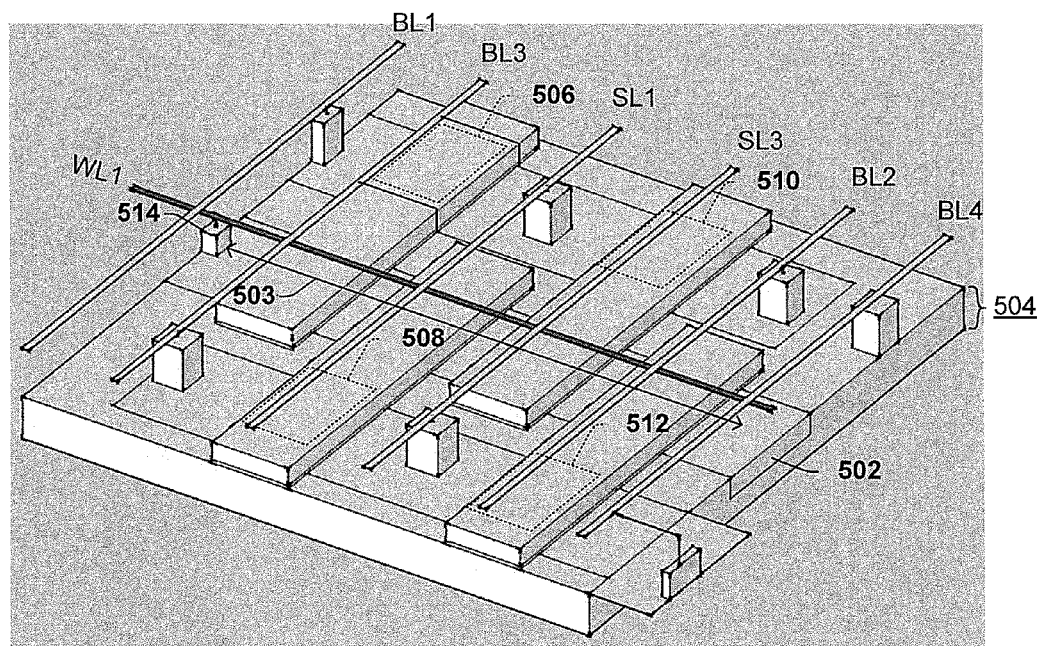
FIG. 5 is a perspective view of some embodiments of a memory unit including four memory cells.

FIG. 5 shows a perspective view of one "tile" or one memory unit 500 that includes four memory cells. For clarity of illustration, dielectric regions (other than gate dielectrics) have been omitted from this figure. Each of the four memory cells in FIG. 5 includes a transistor and a capacitor to cooperatively store a data state, as previously described with regards to FIGS. 1-2. However, for simplicity, only first gate 506, second gate 508, third gate 510, and fourth gate 512 are labeled; and the corresponding transistors and/or capacitors are not labeled with reference numerals. Notably within this memory unit 500, the memory cells are arranged to have an "alternate gate coupling" arrangement, which helps provide a particularly dense cell layout. In this alternate gate coupling arrangement, a wordline WL1, which is formed of a silicide blocking region and/or polysilicon aligned over an active region 502 in the substrate 504, extends along a line 503 through a central region of the memory unit 500 such that gates of successive transistors are arranged on alternating sides of the wordline WL1. More specifically, moving from left to right along wordline WL1 in FIG. 5, first gate 506 is on a first side of the wordline WL1, second gate 508 is on a second, opposite side of the wordline WL1, third gate 510 is again on the first side of the wordline WL1, and fourth gate 512 is on the second side of the wordline WL1. The lower plates of the capacitors, which are not viewable in FIG. 5 but which are formed in highly doped active region 502 buried in the substrate 504 under the wordline WL, are each coupled to WL1 through contact 514. The capacitors being arranged side by-side in a regularly repeating pattern limits misalignment issues during manufacturing. One factor that helps limit this misalignment is the fact that the active region 502 extends along the line 503, rather than twisting or turning through the substrate 504. This is because existing techniques, which use twists or turns in the active region 502, help ensure misalignment does not occur by providing some minimal spacing between edges of the active region. For twists and turns, this minimal spacing between edges increases the overall area of the memory cell, relative to linear active region 502. Thus, because active region 502 extends along line 503, it has fewer corners and it can avoid area increases due to the twists and turns, thereby helping to reduce the area of the memory unit 500 and/or limit misalignment issues.

FIG. 6A shows a top layout view 600 corresponding to FIG. 3's schematic, and FIGS. 6B-6C show cross-sectional views as indicated. Like FIG. 3's schematic, the layout includes memory units (e.g., 602), which are arranged in a series of rows and columns. Wordlines (WL) run in parallel along respective rows, and bitlines (BL) and sourcelines (SL) extend along respective columns.

At the intersection of Row 1 and Col. 1 is a first memory unit 602, which is roughly divided into quadrants by a first wordline WL1 and a pair of sourcelines SL1, SL2. Four 1T1C memory cells are arranged within the first memory unit— namely a first memory cell 604, a second memory cell 606, a third memory cell 608, and a fourth memory cell 610. Each memory cell can be considered to have a T-shaped layout (notwithstanding WL/capacitor contact 612, which is shared for the four memory cells in the memory unit 602).

Each memory cell includes a capacitor and a transistor. As shown by cutaway lines in FIG. 6A, FIG. 6B shows a cross-sectional view of capacitor 614 and FIG. 6C shows a cross-sectional view of transistor 616. The capacitor 614 is made up of a first capacitor plate 618, a second capacitor plate 620, and a dielectric 622 separating the first and second capacitor plates 618, 620. A shared WL/capacitor contact 612 couples the wordline (e.g., WL1) to the first capacitor plate 618, which includes n-doped regions (e.g., 624, 626, 628) in substrate 630. The second capacitor plate 620, which is typically a polysilicon layer 632 covered by a silicide blocking layer 634 (e.g., RPO layer see FIG. 6A), is coupled to a gate electrode 636 of transistor 616 via a polysilicon segment 638 and/or by higher level interconnect.

Memory units such as memory unit 602 can be tiled together in a regularly repeating pattern to provide a denser layout than has been previously achievable. For example, the memory unit 602 illustrated in FIG. 6A can be arranged in a given technology node to have a width (e.g., measured parallel to the rows) of approximately 3.8 um and a height (measured parallel to the column) of approximately 3.5 um. In such an implementation, because the memory unit 602 includes four memory cells arranged in an area of 3.5 um×3.8 um=13.3 um$^2$, the average unit cell area is approximately 3.3 um$^2$. Again, compared to existing layouts where the unit cell area was approximately 4.4 um$^2$, this is a significant improvement in density. This improvement is density is especially attractive as various embodiments are compatible with standard CMOS logic process flows and avoids misalignment issues for capacitors of the memory cells.

Thus, some embodiments relate to a memory device including a plurality of memory units tiled together to form a memory array. A memory unit includes a plurality of memory cells, which include respective capacitors and respective transistors, disposed on a semiconductor substrate. The capacitors include respective lower plates disposed in a conductive region in the semiconductor substrate. A wordline extends over the conductive region, and a contact couples the wordline to the conductive region so as to couple the wordline to the lower plates of the respective capacitors. The respective transistors are arranged so successive gates of the transistors are arranged on alternating sides of the wordline.

Some embodiments relate to a memory array. The memory array includes a plurality of memory units tiled together in rows and columns. A memory unit at an intersection of a row and a column includes four memory cells including four transistors, respectively, and four capacitors, respectively. The four capacitors include respective lower plates disposed in a conductive region in the semiconductor substrate. A wordline extends in parallel with the row and is coupled to the conductive region via a contact. The four transistors of the memory unit are arranged so successive gates of the transistors are arranged on alternating sides of the wordline. First and second bitlines extends along opposite edges of the column and run perpendicular to the wordline.

Still other embodiments relate to a memory array that includes a plurality of memory units tiled together so as to abut one another along rows and columns of the memory array. A wordline passes through a memory unit so as to divide the memory unit into first and second memory cell subgroups. First and second sourcelines are proximate to one another and divide the memory unit into third and fourth regions. The wordline and first and second sourcelines collectively divide the memory unit into quadrants. A plurality of memory cells are arranged in respective quadrants of the memory unit. A memory cell includes a transistor having a gate electrode and source and drain regions spaced apart by a channel region under the gate electrode, and a capacitor having a first plate coupled to the wordline and a second plate coupled to the gate electrode.

Although the disclosure has been shown and described with respect to a certain aspect or various aspects, equivalent alterations and modifications will occur to others of ordinary skill in the art upon reading and understanding this specification and the annexed drawings. For example, it will be appreciated that the terms "first", "second", "third" and the like do not imply any spatial or temporal relationship therebetween, but rather are just generic identifiers. Further, these terms are interchangeable in this disclosure. For example, although one portion of this disclosure may refer to a "first" feature and a "second" feature, because first and second are merely generic identifiers, they features may also be referred to as a "second" feature and a "first" feature respectively. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device including a plurality of memory units tiled together to form a memory array, a memory unit comprising:
   a plurality of memory cells disposed on a semiconductor substrate, the memory cells including respective capacitors and respective transistors, wherein the capacitors include respective lower plates disposed in a conductive region in the semiconductor substrate;
   a wordline extending over the conductive region; and
   a contact coupling the wordline to the conductive region so as to couple the wordline to the lower plates of the respective capacitors for the memory unit;
   wherein the respective transistors are arranged so successive gates of the transistors are arranged on alternating sides of the wordline.

2. The memory device of claim 1, wherein the respective lower plates of the capacitors for the memory unit correspond to a continuous conductive region in the semiconductor substrate.

3. The memory device of claim 2, wherein the conductive region is a linear segment extending through the semiconductor substrate in a central region of the memory unit.

4. The memory device of claim 2, wherein the conductive region corresponds to lower plates of four capacitors of the memory unit.

5. The memory device of claim 2, wherein the wordline is made of a silicide blocking layer disposed over the continuous conductive region.

6. The memory device of claim 1, further comprising:
first and second bitlines extending along opposite edges of the memory unit and running perpendicular to the wordline.

7. The memory array of claim 6, further comprising:
one or more sourcelines extending in parallel with the first and second bitlines, the one or more sourcelines being arranged over the memory unit between the first and second bitlines.

8. A memory array formed on a semiconductor substrate, comprising:
a plurality of memory units tiled together in rows and columns, wherein a memory unit at an intersection of a row and a column includes four memory cells including four transistors, respectively, and four capacitors, respectively, wherein the four capacitors include respective lower plates disposed in a conductive region in the semiconductor substrate;
a wordline extending in parallel with the row and coupled to the conductive region via a contact, wherein the four transistors of the memory unit are arranged so successive gates of the transistors are arranged on alternating sides of the wordline; and
first and second bitlines extending along opposite edges of the column and running perpendicular to the wordline.

9. The memory array of claim 8, wherein the conductive region extends in a linear fashion through the memory unit.

10. The memory array of claim 8, further comprising:
one or more sourcelines extending in parallel with the column and arranged to divide the respective memory unit into respective left and right memory cell subgroups each having two memory cells therein.

11. The memory array of claim 8, wherein a memory cell comprises:
a capacitor comprising: a first capacitor plate, a second capacitor plate, and a dielectric separating the first and second capacitor plates, wherein the first capacitor plate is formed in the semiconductor substrate and is coupled to the wordline via the contact; and
a transistor comprising a gate electrode, a source region, and a drain region, wherein the source and drain regions are spaced apart by a channel region under the gate electrode, and wherein the gate electrode is coupled to the second capacitor plate.

12. The memory array of claim 11, wherein the source region or the drain region of the transistor is coupled to the first or second bitline.

13. The memory array of claim 11, wherein the first capacitor plate comprises the conductive region in the semiconductor substrate and the second capacitor plate comprises a polysilicon or metal region aligned over the region of the semiconductor substrate.

14. The memory array of claim 11, wherein an amount of charge on the capacitor corresponds to a resistance of the channel region such that the resistance of the channel region is indicative of a data state stored in the memory cell.

15. The memory array of claim 8, further comprising:
third and fourth bitlines extending in parallel with and proximate to the first and second bitlines, respectively.

16. The memory array of claim 15:
wherein the first, second, third, and fourth bitlines are coupled to different respective memory cells of the memory unit.

17. A memory array, comprising:
a plurality of memory units tiled together so as to abut one another along rows and columns of the memory array;
a wordline passing through a memory unit so as to divide the memory unit into first and second memory cell subgroups;
first and second sourcelines proximate to one another and which divide the memory unit into third and fourth regions, wherein the wordline and first and second sourcelines collectively divide the memory unit into quadrants; and
a plurality of memory cells arranged in respective quadrants of the memory unit, wherein a memory cell comprises: a transistor having a gate electrode and source and drain regions spaced apart by a channel region under the gate electrode, and the memory cell further comprising a capacitor having a first plate coupled to the wordline and a second plate coupled to the gate electrode.

18. The memory array of claim 17, further comprising:
first and second bitlines extending along opposite edges of a column of memory units.

19. The memory array of claim 18, wherein the first and second bitlines run perpendicular to the wordline.

20. The memory array of claim 18, further comprising:
third and fourth bitlines proximate to the first and second bitlines, respectively;
wherein the first, second, third, and fourth bitlines are coupled to respective memory cells in respective quadrants of the memory unit.

21. The memory array of claim 17, wherein an amount of charge on the capacitor corresponds to a resistance of the channel region such that the resistance of the channel region is indicative of a data state stored in the memory cell.

* * * * *